United States Patent [19]

Parrott

[11] Patent Number: 5,801,591
[45] Date of Patent: Sep. 1, 1998

[54] MICROWAVE LINEAR OSCILLATOR/ AMPLIFIER UTILIZING A MULTICOUPLED FERRITE RESONATOR

[75] Inventor: Ronald A. Parrott, Healdsburg, Calif.

[73] Assignee: Verticom, Inc., Santa Rosa, Calif.

[21] Appl. No.: 855,169

[22] Filed: May 13, 1997

[51] Int. Cl.$^6$ .................................................. H03B 5/18
[52] U.S. Cl. ........................ 331/96; 331/117 D; 331/177 R
[58] Field of Search ................................. 331/96, 117 D, 331/107 DP, 177 R

[56] References Cited

U.S. PATENT DOCUMENTS

| | | | |
|---|---|---|---|
| 4,247,837 | 1/1981 | Mezak et al. | 333/202 |
| 4,270,097 | 5/1981 | Le Tron et al. | 331/177 R |
| 4,283,691 | 8/1981 | Burgoon | 331/116 R |
| 4,554,516 | 11/1985 | Basawapatna | 331/76 |
| 4,630,002 | 12/1986 | Leiba | 331/96 |
| 4,758,800 | 7/1988 | DiBiase et al. | 331/1 R |
| 4,988,959 | 1/1991 | Khanna et al. | 331/117 D |
| 5,115,209 | 5/1992 | Grace et al. | 331/49 |
| 5,200,713 | 4/1993 | Grace et al. | 331/49 |
| 5,220,292 | 6/1993 | Bianchini et al. | 331/1 R |
| 5,428,324 | 6/1995 | Andersson et al. | 333/202 |
| 5,517,161 | 5/1996 | Andersson et al. | 333/202 |

OTHER PUBLICATIONS

Korber et al., "A 3.67 GHz Permanent Magnet, Biased YIG–Tuned Fundamental Feedback Oscillator", Microwave Journal, (Oct. 1993), pp. 104 and 107.

Primary Examiner—Siegfried H. Grimm
Attorney, Agent, or Firm—Townsend & Townsend & Crew LLP

[57] ABSTRACT

A multi-octave ferrite oscillator topology that utilizes transformer coupling to provide the proper phase shift in the feedback loop. In a specific embodiment, a 10 mil YIG sphere is loosely coupled to 20 mil input and output loops, both of which are connected to a GaAs integrated circuit that includes a Darlington pair of bipolar transistors. The Darlington pair provides high gain, high output power, and low parasitic reactance up to about 10 GHz. A resistor bridge across the base of the input transistor of the Darlington pair insures a substantially real input impedance over a wide bandwidth.

13 Claims, 6 Drawing Sheets

MICROWAVE LINEAR OSCILLATOR/ AMPLIFIER UTILIZING A MULTICOUPLED FERRITE RESONATOR

BACKGROUND OF THE INVENTION

This invention relates to structures for high frequency fundamental resonators, particularly for frequency sources and for filters. More particularly, the invention relates to ferrite oscillators, such as yttrium-iron-garnet ($Y_3Fe_5O_{12}$ or YIG) oscillators.

Oscillators are used as frequency sources in many applications. Some applications, such as clock circuits, simply require a regularly-spaced stream of pulses, for which a single-frequency oscillator may be sufficient. Other applications, such as a local oscillator in a swept hetrodyne receiver or the oscillator in a phase-locked loop, may require a tunable oscillator. It may be desirable to tune an oscillator both between bands (e.g. over an octave) and also to frequency modulate (FM) an oscillator about a center frequency. This FM is typically less than an octave.

Ferrite oscillators are a favored type of oscillator for many applications because of their typically high frequency of oscillation (about 1 GHz to about 100 GHz), wide tuning range (over one octave), linear tuning characteristics, and spectral purity. In a general sense, a circuit will oscillate at a frequency if there is a gain element that receives a feedback signal at its input that is 360 degrees out of phase with the gain element's output signal. A resonant circuit may be used to provide the desired phase shift at the desired frequency in an oscillator circuit. One way to view the resonant circuit is that, while the active device is capable of oscillating over a wide frequency range, the resonant circuit makes sure that the desired frequency provides the strongest feedback signal. A ferrite element may be used in an oscillator structure in several ways.

Figure 1:
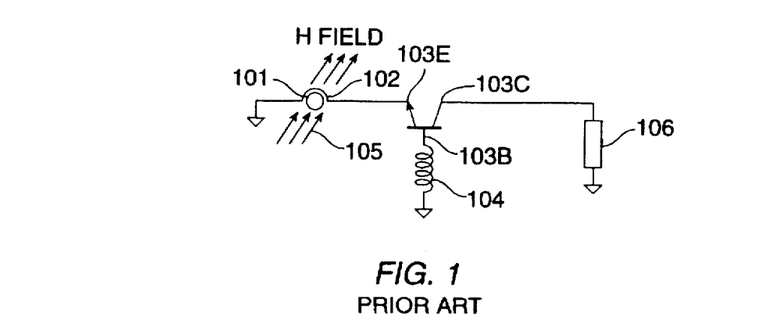
FIG. 1 is simplified diagram of a conventional YIG oscillator.
Figure 2:
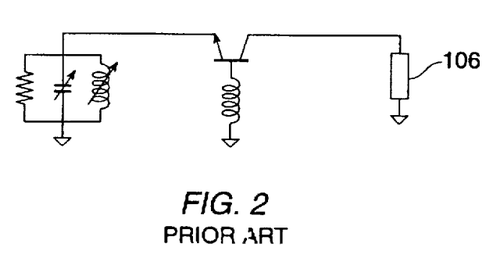
FIG. 2 is a simplified equivalent circuit diagram of the oscillator shown in FIG. 1.

One conventional ferrite oscillator structure 100 is shown in FIG. 1. A ferrite sphere 101 is coupled to a loop 102, which is connected to the emitter 103E of an NPN bipolar transistor 103. The base 103B of transistor 103 is connected to ground with an inductor 104, which acts as a feedback element. The collector 103C of the transistor provides the output of the oscillator to the load 106. Ferrite sphere 101 is placed in an external magnetic field, represented by arrows, 105 that is not parallel to the magnetic field created by current flow in the loop. The external magnetic field has sufficient strength to align the ferromagnetic dipoles within the sphere along the axis of the external field. In this pre-resonant state, it is unclear at which frequency the transistor may oscillate at; however, current flow, even direct current or noise current, through the loop creates magnetic fields orthogonal to the external field. This orthogonal magnetic field creates a force on the aligned dipoles, forcing them out of the plane of the external field and causing them to precess. One analogy might be to slightly pushing over a spinning top. The dipoles within the ferrite sphere precess in unison, and induce current in the coupling loop as the magnetic dipole vectors cross the plane of the loop. This provides a resonant current, resulting in an equivalent circuit as represented in FIG. 2.

If the emitter provides negative resistance at the resonant frequency and the base inductance provides feedback 180 degrees out of phase, then the resonant feedback signal is likely to be much greater than any other feedback signal and the oscillator will oscillate at the resonant frequency. The resonant frequency may be changed by changing the strength of the external magnetic field applied to the ferrite sphere. This is typically done by applying at least some of the external field with an electromagnet, and increasing the current through that magnet. Applying a stronger magnetic field will create a relatively stronger restorative force on the dipoles in the ferrite sphere, and cause them to precess at a higher frequency.

The upper range of this frequency may be limited by several practical considerations. First, the space or power available to drive the electromagnet to sufficiently high fields may be limited. Second, coupling between the sphere and the loop may diminish at higher frequencies. Third, the active element may exhibit negative resistance over a limited frequency range. Finally, the feedback element may operate over a limited frequency range, and not provide the desired phase shift or loop gain to maintain oscillations at the higher frequencies. This is especially true in conventional oscillators, where the feedback element is principally reactive (rather than resistive), and must provide feedback with the proper phase as the impedances of the resonator and transistor vary over the tuned frequencies. Conventional oscillators also often use a single device, typically a transistor, as the active element. There is typically a trade-off between output power and parasitic reactances, both of which are related to device size. These device reactances may resonate with other circuit reactances, such as bond wire inductances, and limit the range of oscillation. The unfortunate result is that conventional oscillators often perform optimally over frequency ranges much smaller than the gain bandwidth of the transistor.

Therefore it is desirable to provide an oscillator capable of oscillating over a wider frequency range. Such an oscillator may have a topology that enhances utilization of the gain element bandwidth by reducing the reactive components of the gain element impedances. Such an oscillator may also have a feedback structure that provides the 180 degree phase shift with a more constant loop loss, so that the oscillator bandwidth is not limited by reactive feedback elements.

SUMMARY OF THE INVENTION

A linear tunable oscillator is described. A ferrite element is magnetically saturated to produce a magnetic resonance. An active element provides real impedance and gain over a wide frequency range at an input port. The input port is electrically coupled to a first inductive coupling structure that is electrically coupled to an RF current source/sink, such as ground. The magnetic resonance in the ferrite element induces a current in the coupling structure which is amplified and shifted in phase 180 degrees by the active element. The output of the active element drives a second inductive coupling structure that closes a feedback loop and provides an oscillator output signal. The first inductive coupling structure, ferrite element, and second inductive coupling structure act as a transformer when tuned to a resonance, thus providing the proper phase shift and current gain.

In one embodiment, a 10 mil sphere of 600 Gauss YIG is loosely coupled to a coupling structure of two half loops of thin sheet metal bent on a 30 mil diameter. The active element in the oscillator is a GaAs integrated circuit (IC) that includes a Darlington pair of bipolar transistors with a resistor divider across the base of the input transistor. One of the loops is coupled to ground through a capacitor and drives the input of the GaAs IC. The output of the GaAs IC drives the second loop, the other end of which provides the oscillator output. The two loops form a transformer with the YIG sphere, providing appropriate phase shift for oscillation over a wide bandwidth. A second Darlington GaAs IC can be connected to the oscillator output to provide improved output power and power linearity. The loops and GaAs ICs are part of a hybrid microcircuit that lies, along with the YIG sphere, within an air gap of a tunable magnetic circuit. An oscillator of this configuration has produced at least 10 dBm output power from 2 GHz to 9.5 GHz.

The invention will be better understood by reference to the following detailed description in connection with the accompanying drawings.

DESCRIPTION OF SPECIFIC EMBODIMENTS

Figure 3:
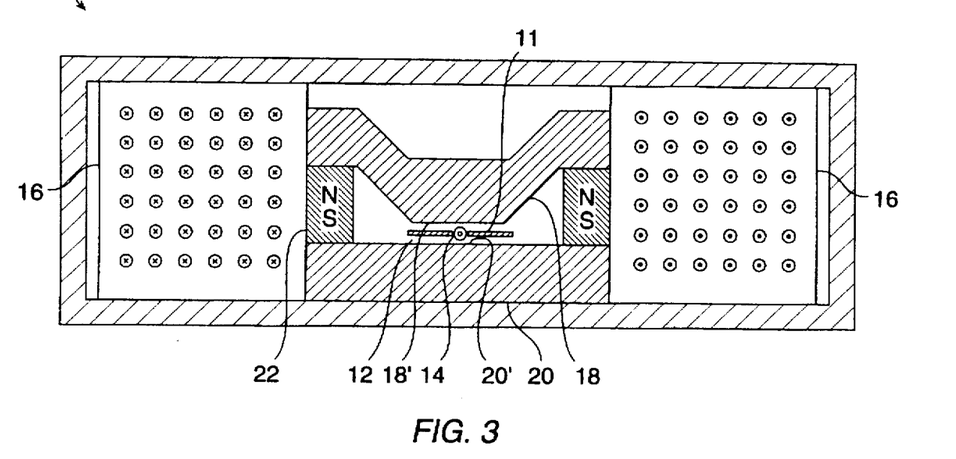
FIG. 3 is a simplified cross-sectional view of an exemplary tunable magnetic circuit and oscillator structure.

FIG. 3 shows a cross-sectional view of an exemplary oscillator which may incorporate the present invention. A ferrite resonator element, such as a yttrium-iron-garnet (YIG) sphere 14, and a substrate 11 are placed within a gap 12 within magnetic circuit 10. The substrate 11 provides mechanical support for the coupling loops (not shown) and other components. The YIG sphere 14 is highly polished (to a specular finish) and is between about 5 mils and 40 mils in diameter. In a specific embodiment, the YIG sphere is about 10 mils in diameter and is fabricated from a single crystal. The magnetic circuit 10 provides a high-intensity, controlled magnetic field between the opposing faces 18' and 20' of the gap. A relatively large electromagnet 16, shaped in the form of a solenoid, surrounds the gap 12 and creates a magnetic flux field across the gap 12. A permanent magnet 22 may provide a constant bias of magnetic flux parallel to the flux from the electromagnet 16. This may reduce the drive current through the electromagnet 16 that would otherwise be required to saturate the YIG sphere 14 and initiate oscillation. A first high-permeability element 18 and a second high-permeability element 20 define a working flux path across the gap 12 in which the YIG sphere 14 may resonate in the presence of the controlled magnetic field. A suitable structure is more completely described in co-pending application number 08/637,063, filed Apr. 24, 1996, now Pat. No. 5,667,652 and entitled Microwave Ferrite Resonator With Parallel Permanent Magnet Bias by Ronald Parrott, commonly assigned and incorporated in its entirety herein by reference for all purposes.

Figure 4:
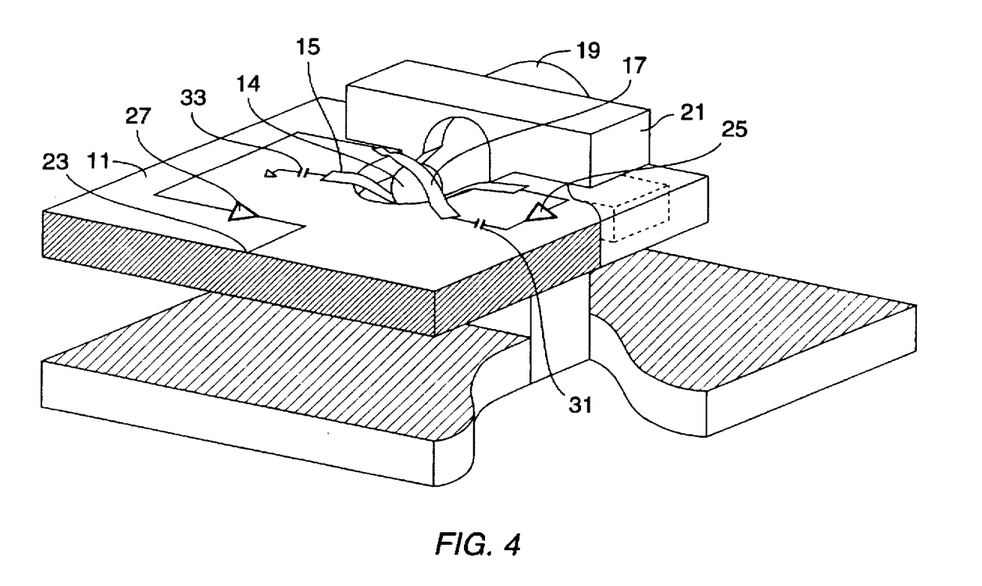
FIG. 4 is a simplified perspective view showing physical and electronic circuit aspects of the present invention.

FIG. 4 is a simplified perspective view showing additional features of an exemplary oscillator structure and circuit. Direct current (DC) bias structures and components are not shown. An assembly holder 21 supports the substrate 11 and YIG rod 19. The assembly holder 21 may be made of any suitably stiff material, and in a specific embodiment is electron-discharge machined (EDM) from beryllium-copper alloy. The substrate 11 may be a dielectric material, such as alumina, sapphire, beryllium oxide, polymer or polymer composite, or mica, suitable for forming microcircuits on. In a specific embodiment, a co-planar circuit is defined on the upper surface of substrate 11; however, a micro-strip circuit or other types of circuits could also be utilized. One advantage of a co-planar circuit is that the backside of the substrate 11 need not be metallized, allowing the co-planar circuit to be defined prior to grinding or polishing the backside of the substrate.

In this embodiment, the first and second inductive coupling structures are realized as loops 15 and 17. These loops are photo-formed from beryllium-copper alloy sheet and are gold plated. Other processes, such as EDM or laser cutting may also be used to fabricate the loops. Coupling structures may also be formed from wire or ribbon, or formed as a trace or transmission line on a printed circuit, or as metallized via holes in a substrate or monolithic microwave integrated circuit.

The loops 15 and 17 are bonded to metal traces on the substrate 11 using thermocompression wedge bonding, or other suitable means, such as solder or conductive epoxy. The loops do not need to be orthogonal to each other, as is typical in YIG filter structures where coupling between the loops may degrade the filter's isolation characteristics.

An active element 25 may be attached directly to the ground plane of the co-planar circuit (not shown) using conductive epoxy, solder, or other means. In a specific embodiment, the active element is a semiconductor chip with a backside ground connection. A blocking capacitor 31 DC isolates active element 25 from a buffer amplifier 27. A current source (current sink) 33 is provided by a coupling capacitor that provides a path to ground for radio frequency (RF) signals within the oscillator bandwidth while blocking DC from the active element 25. Wire bonds, including multiple parallel wire bonds, may be used to inter-connect the active element 25, coupling capacitor 33, blocking capacitor 31, buffer amplifier 27, co-planar microcircuit (not shown), and other circuit elements (not shown). Other means, such as thermocompression wedge bonding of ribbon or mesh may alternatively be used to interconnect circuit elements, as is known in the art.

Figure 5:
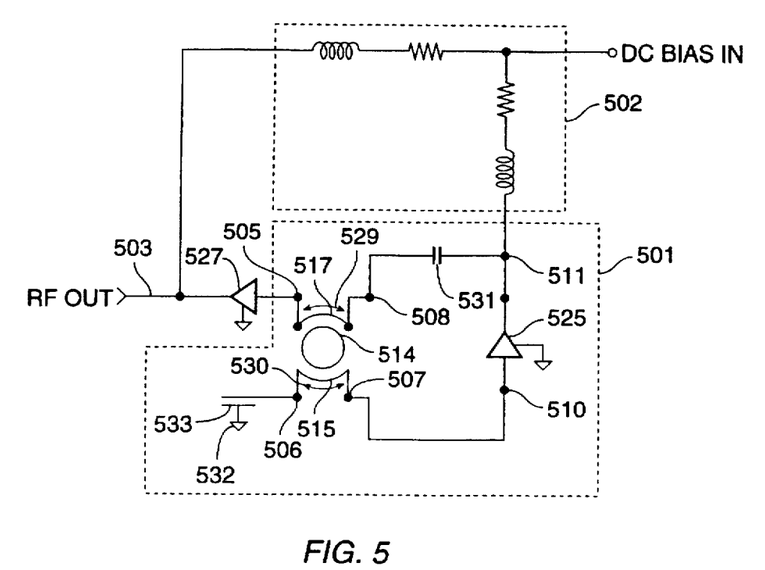
FIG. 5 is a simplified diagram of a wideband YIG oscillator in accordance with the present invention.

FIG. 5 is a simplified diagram of a wideband oscillator in accordance with the present invention. An oscillator section 501 contains a ferrite resonating element, in this embodiment a YIG sphere, 514, which is disposed between a first inductive coupling structure 515 and a second inductive coupling structure 517. A first inductive coupling structure port 506 is coupled to ground 532. In this embodiment, a coupling capacitor, 533 couples the first inductive coupling structure to ground so that a first resonant RF current, represented by a double-ended arrow, 530 may flow through the first inductive coupling structure 515 in response to the ferrite element resonance. A second inductive coupling structure port 507 is coupled to the active element 525 at a first active element port 510. A second active element port 511 is coupled to the second inductive coupling structure 517 at a third coupling structure port 508 through a blocking capacitor 531 such that a second resonant RF current, represented by a double-ended arrow, 529 may flow in second inductive coupling structure. A fourth coupling structure port 508 is electrically coupled to the oscillator section output port 505. A buffer amplifier 527 between the oscillator section output port 505 and the oscillator circuit output port 503 may improve impedance matching and provide higher output power at the oscillator circuit output port 503. The DC power is provided for the buffer amplifier 527 and the active element 525 through a bias network 502, returning to ground as shown, or another DC bias network may be used, such as providing power at a port equivalent to the DC input ports. At resonance, the YIG sphere 514, input loop 515, and output loop 517 act as a transformer to couple energy from the output of the active element 525 back to the input of the active element 525. The transformer topology provides 180 degrees of phase shift between the input loop 515 and the output loop 517 by inducing current in the input loop 515 in one direction, while inducing current in the output loop 517 in the opposite direction. Alternatively, the loops could be configured in a transformer topology to provide 0 degrees of phase shift by configuring the induced current to be in the same direction in both loops. A further advantage of a transformer topology is that the phase shift is non-dispersive, that is, the phase shift does not vary significantly with frequency. Therefore, the transformer topology provides a wide-band 180 degree phase shift element.

Figure 6:
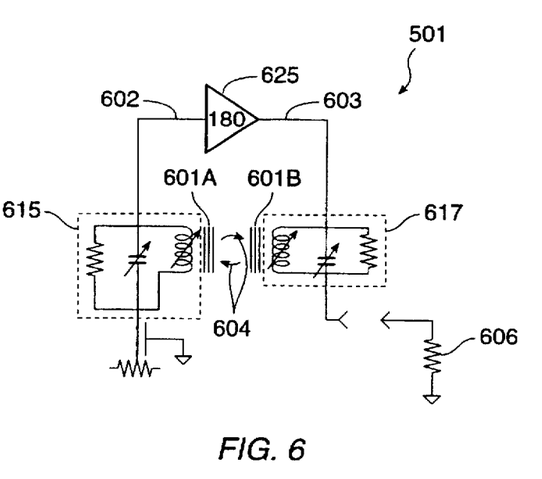
FIG. 6 is a simplified equivalent circuit of the structure shown in FIG. 5.

FIG. 6 is a simplified equivalent circuit of the oscillator section 501, shown in FIG. 5. The YIG sphere, represented by transformer bars 601A and 601B and circular arrows 604, couples the input port 602 of a gain device 625 to the gain device output port 603 and load 606. During resonance, the YIG sphere and coupling loops (not shown) are partially represented by the dual tunable resonant circuits 615 and 617. As can be seen from this equivalent circuit, the feedback path is coupled through the sphere by both loops, and not through ground via a reactive element. This provides 180 degrees of phase shift through the transformer over a wide frequency range, which adds with a 180 degrees of phase shift through the gain device to provide a signal shifted 360 degrees at the input port 602. This provides the necessary phase shift for oscillator performance. The oscillator output 605 may be coupled to a buffer amplifier, if desired. A further advantage of this configuration is that a real impedance is presented on both sides of the loop.

Figure 7:
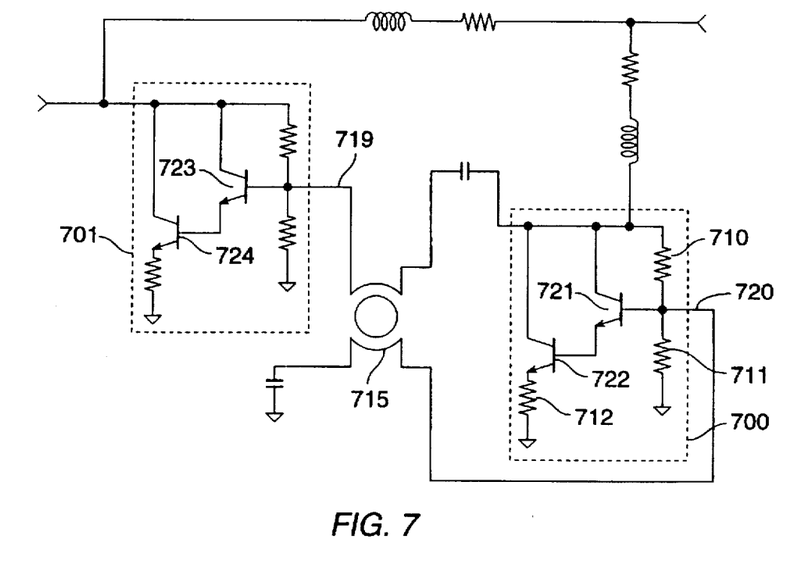
FIG. 7 is diagram of an embodiment of the present invention using Darlington amplifiers as an active element and as a buffer amplifier.

FIG. 7 is an embodiment of the oscillator shown in FIG. 5 using a Darlington pair in the active element 700 and in the output buffer amplifier 701. In a specific embodiment, the transistors 721, 722, 723, and 724 are gallium arsenide (GaAs) bipolar transistors. Furthermore, the transistors forming a Darlington pair may be fabricated on a single chip of GaAs as represented by the active element integrated circuit 700 that incorporates input resistors 710 and 711 and a load resistor 712 in addition to the transistors. One reason the Darlington pair configuration is preferred is that it provides an active element with low input and output reactance while retaining high gain and output power. The Darlington input transistor 721 may be small, minimizing base-emitter capacitance for example, while the Darlington output transistor 722 may be optimized for power output. Therefore, the base impedance of the input transistor 721 may have relatively little reactance.

The resistance values of the input resistors 710 and 711 may be chosen as to provide an appropriate bias voltage on the base of the input transistor 721, as is known in the art. In one embodiment, the values of the input resistors 710 and 711 are additionally chosen such that the input impedance at the Darlington input port 720 is nominally 50 ohms, but other values will also work.

Fabricating the active element 700 as an integrated circuit keeps parasitic reactances low between circuit elements of active element. Therefore, not only is the input impedance at the Darlington input port 720 a fairly constant 50 ohms, it is also nearly completely resistive. Because the input impedance of the Darlington input port 720 is resistive, it has very little reactance that may form a resonant circuit with the characteristic reactance of the input loop 715. The buffer amplifier 701 operates similarly to provide a predominately resistive 50 ohm input impedance at the buffer input port 719. It is understood that the active element 700 and the buffer amplifier 701 could be fabricated out of discrete devices, such as transistors and resistors, and still obtain advantages of the present invention. Additionally, a 50 ohm input impedance is not required, and may be raised or lowered according to the impedance of the coupling loop at resonance, which is affected by loop-sphere coupling.

The degree of coupling between a loop and a resonating ferrite sphere is a function of the area of the loop to the volume of the sphere. Understanding of loop-sphere coupling may be more clear with reference to FIG. 8, which is a power-versus-frequency plot for a generic ferrite oscillator. The quality (Q) of the resonance 800 may be defined by the resonant frequency 805 divided by the 3 dB bandwidth 801. The 3 dB bandwidth is the width, in frequency, of the resonance 3 dB below the maximum power level 802. A higher Q resonator exhibits a narrower 3 dB bandwidth and hence a higher Q. Q is a measure of the rate at which energy is lost from the resonant structure and may be affected by many factors, including the surface finish of the sphere (scattering the uniform precessional mode at the surface), the atomic composition of the ferrite, voids or non-magnetic inclusions within the sphere (scattering the uniform precessional mode within the sphere or de-coupling magnetic moments within the sphere), residual strain within the sphere, and coupling between the sphere and loop.

Figure 8:
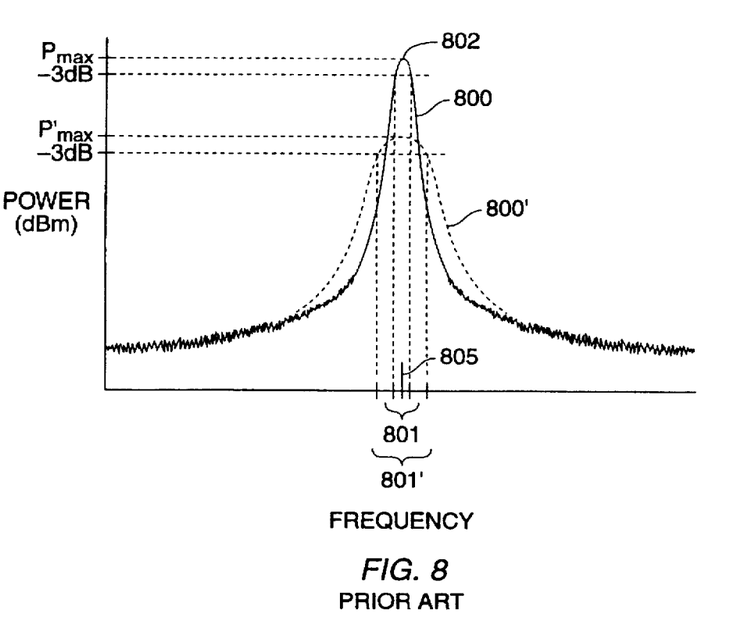
FIG. 8 is a general plot of output power versus frequency of a typical ferrite oscillator, illustrating aspects relating to oscillator characterization.

A loop-sphere structure is "critically coupled" if one-half the energy of each resonant cycle in the ferrite sphere is coupled into the loop. In a "loosely coupled" structure the Q approaches the unloaded Q of the resonator. In a "tightly coupled" structure the Q of the resonator is degraded by the power coupled from the sphere to the load connected to the loop. As shown in FIG. 8, the resonance 800' of a tightly coupled structure 800' has a wider 3 dB bandwidth 801' at the same resonant frequency 805 and hence has a lower Q.

An active element with high gain and resistive input impedance, such as the Darlington pair discussed above, allows a loosely coupled loop-sphere structure, providing oscillations over a wide bandwidth. In one embodiment incorporating GaAs Darlington integrated circuits, a sphere with a 10 mil diameter was loosely coupled to a pair of gold-ribbon half loops, each formed with a nominally 30 mil diameter. The YIG sphere was manufactured from a single crystal. The crystal was gallium-substituted (also known as gallium-doped) to lower the minimum frequency of operation, as is known in the art. For the purposes of this specification and associated claims, "YIG" is intended to describe pure YIG or substituted YIG. The internal magnetization saturation field strength × 4Π (4ΠM$_s$)of the sphere was about 600 Gauss. The resulting oscillator produced at least 10 dBm of power from between 2 GHz to 9.5 GHz. It is believed that this output range of over two octaves is at least partly related to being able to loosely couple to the sphere.

Loosely coupling to a resonating sphere has other advantages, as well. Many conventional ferrite oscillators tightly couple to the sphere to provide sufficient power at the active element to maintain oscillation. More tightly coupled structures typically drive more power through the sphere, which tends to heat the sphere. This in turn may create a thermal gradient within the sphere, especially if heat is lost at the point where the sphere is mounted. Because the resonant characteristics of the ferrite typically are affected by temperature, a non-uniform temperature throughout the sphere may produce unexpected and unwanted results.

Other undesirable events may occur as more power is coupled through the sphere. For example, other resonant modes (than the uniform precessional mode) may be excited. Many of these modes tune at a different rate (with respect to applied magnetic field) than the uniform precessional mode, and may cross through a desired point of operation (frequency), producing an unwanted spurious signal. Additionally, the power may excite surface acoustic waves on the sphere (commonly referred to as "squegging") which typically form sidebands on the desired resonance signal. Therefore, loosely coupled structures may be preferred in several instances.

Gain devices typically exhibit gain over a wider frequency range than that same device will oscillate over when used in an oscillator circuit. This may be because of mismatch losses between elements in the loop, such as the mismatch loss between a coupling loop and the input of the gain device, or because the input reactance of the gain device alters the phase relationship of the feedback signal. One way to improve the frequency range of oscillation would be to reduce the feedback loop reactance, by reducing the input reactance of the gain device, for example. Another way may be to provide additional gain in the feedback loop.

Figure 9:
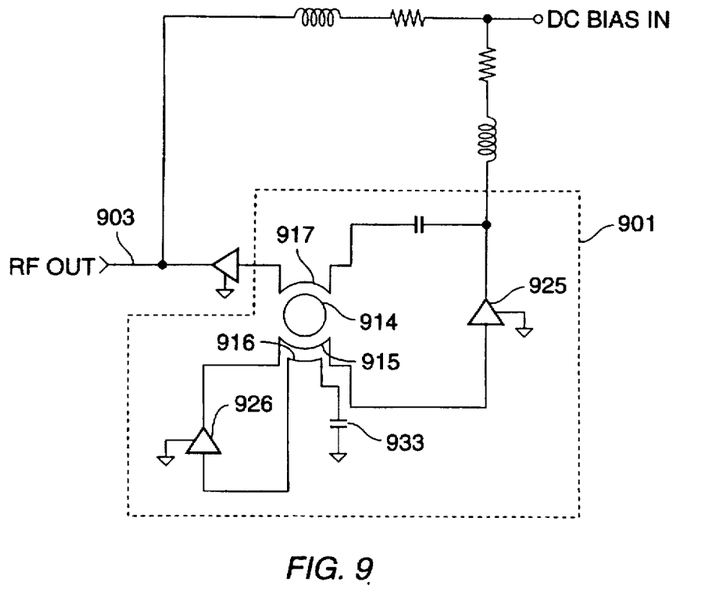
FIG. 9 is an alternative embodiment of the present invention showing a simplified diagram of a wideband YIG oscillator with additional loop gain.

FIG. 9 is an alternative embodiment of the present invention showing a simplified diagram of a wideband YIG oscillator with additional gain in the feedback loop. A second active element 926 with a second input loop 916 is added to the oscillator section 901 in addition to a first active element 925 and a first input loop 915. In this embodiment, the first input loop 915 connects the output of the second active element 926 to the input of the first active element 925. The second input loop 916 inductively couples to the YIG sphere 914 and is connected to the input of the first active element 926 and to an RF termination through a coupling capacitor 933. One feature of this double-input-loop configuration is that it presents an opportunity to obtain an additional 180 degrees of wide-band, non-dispersive phase shift between the output of the first active element and the input of the second active element. This may be desirable if the active elements provide little phase shift, as the necessary 360 degrees of phase shift necessary for oscillator operation can be provided by the YIG sphere and coupling topology.

Figure 10A:
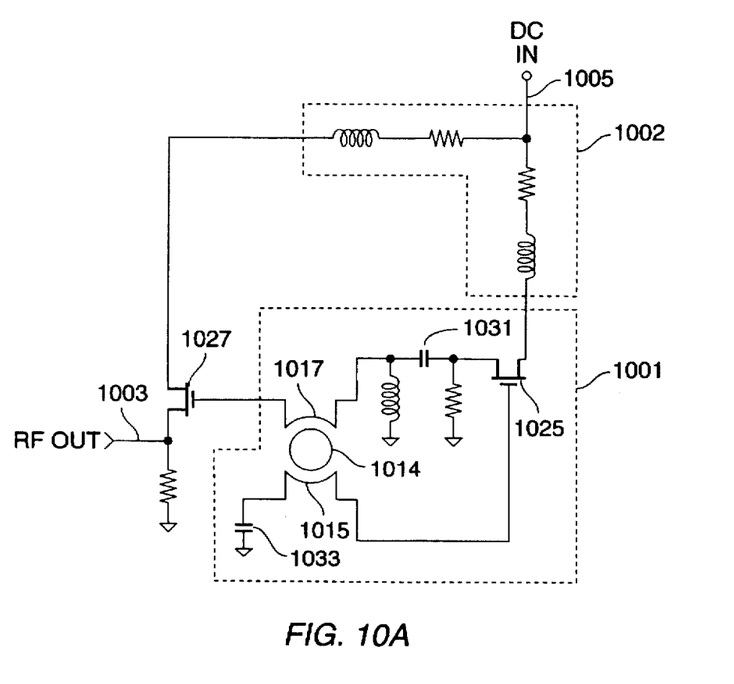
FIG. 10A is an alternative embodiment of the present invention showing a simplified diagram of a high-frequency wideband YIG oscillator incorporating a field effect transistor as an active element in a transformer-coupled topology.

FIG. 10A is an alternative embodiment of the present invention showing a simplified diagram of a high-frequency wideband YIG oscillator using a GaAs field effect transistor (FET) as an active element 1025 coupled to a YIG sphere 1014 through an input coupling loop 1015, which is RF coupled to ground through a coupling capacitor 1033. A blocking capacitor 1031 provides DC isolation between active element 1025 and an optional GaAs FET configured as a buffer amplifier 1027 on the output of oscillator section 1001. Power is supplied through the DC bias port 1005, and distributed to the active element 1025 and the buffer amplifier 1027 through a bias network 1002.

Figure 10B:
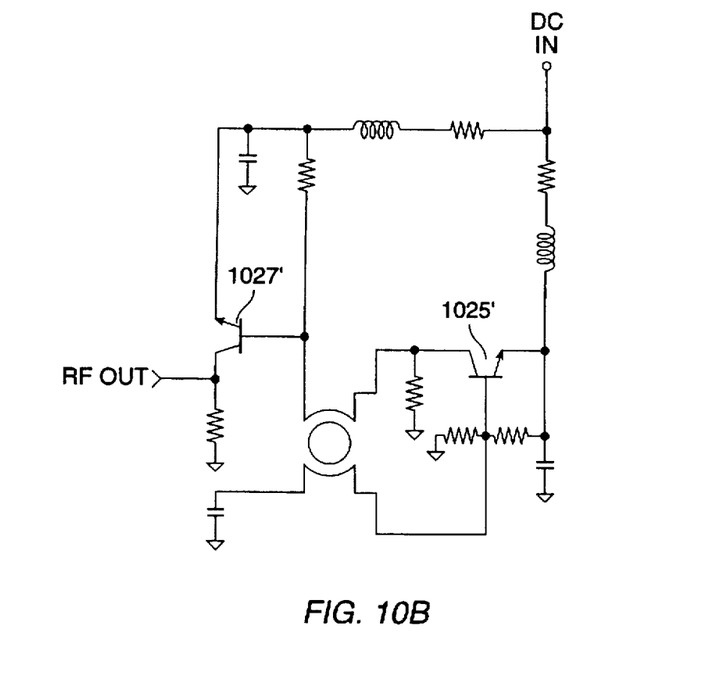
FIG. 10B is an alternative embodiment of the present invention showing a simplified diagram of a YIG oscillator incorporating a discrete bipolar transistor as an active element in a transformer-coupled topology.

An oscillator in the configuration of FIG. 10A was built using a YIG sphere approximately 10 mils in diameter with a 4ΠMS of about 1200 Gauss. Both coupling loops were fabricated with a diameter of nominally 20 mils. The oscillator operated over two octaves up to a frequency of 20 GHz. FIG. 10B is a simplified diagram of a similar alternative embodiment of the present invention using single bipolar transistors for the active element 1025' and for the buffer amplifier 1027'.

Figure 11:
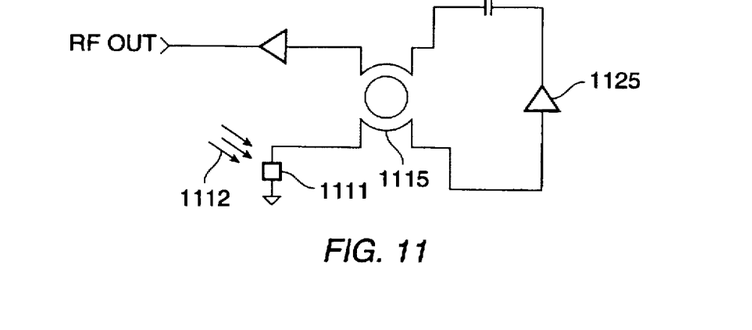
FIG. 11 is an alternative embodiment of the present invention wherein a variable-impedance element is added between the feedback loop and ground potential.

FIG. 11 is a simplified diagram of an alternative embodiment of the present invention incorporating a variable resistance element to limit energy that may otherwise couple through the resonant structure. In this embodiment, the variable resistance element 1111 may be biased (bias circuitry not shown) to increase losses and lower the output level. This effect occurs because gain is limited by the oscillating element. The variable resistance element 1111 may be a positive-intrinsic-negative (PIN) diode, for example, with a bias voltage coupled to the external magnetic coil drive voltage. Alternatively, the variable resistance element 1111 may be a photodiode. An incident light beam 1112, represented in FIG. 11 by arrows, may serve to vary the resistance of the element 1111 to ground, and hence modulate the input signal to the active element 1125 by varying the induced current flowing in the coupling loop, which determines the output level of the active device, based on the loss in the transformer.

The invention has now been explained with reference to specific embodiments. Other embodiments will be apparent to those of ordinary skill in the art. It is therefore not intended that this invention be limited, except as indicated by the appended claims.

What is claimed is:

1. A tunable oscillator apparatus comprising:
    a ferrite resonating element disposed in a magnetic circuit;
    a current source;
    an output port;
    an active element having a first active element port and a second active element port and providing a negative resistance at said first active element port;
    a first inductive coupling structure disposed adjacent to said ferrite resonating element, said first inductive coupling structure having a first coupling structure port and a second coupling structure port, said first coupling structure port connected to said current source and said second coupling structure port connected to said first active element port; and
    a second inductive coupling structure also disposed adjacent to said ferrite resonating element, said second inductive coupling structure being geometrically arranged such that a first resonant current in said first inductive coupling structure is at substantially 180 degrees phase difference relative to a second resonant current in said second inductive coupling structure, said second inductive coupling structure having a third coupling structure port and a fourth coupling structure port, said third coupling structure port connected to said second active element port and said fourth coupling structure port connected to said output port.

2. The apparatus of claim 1 wherein said active element is a gallium-arsenide integrated circuit comprising a Darlington pair of bipolar transistors.

3. The apparatus of claim 1 wherein said active element is a gallium-arsenide field effect transistor.

4. The apparatus of claim 1 wherein said ferrite resonating element is a sphere comprised of yttrium-iron-garnet or substituted yttrium-iron-garnet.

5. The apparatus of claim 1 wherein said first and said second inductive coupling structures comprise conductive loops.

6. The apparatus of claim 1 further comprising a buffer amplifier, said buffer amplifier having a buffer amplifier input port and a buffer amplifier output port, wherein said buffer amplifier input port is connected to said output port of the apparatus of claim 1.

7. The apparatus of claim 6 wherein said buffer amplifier is a gallium-arsenide integrated circuit comprising a Darlington pair of bipolar transistors.

8. The apparatus of claim 1 further comprising a variable resistance element coupled to said current source of the apparatus of claim 1.

9. The apparatus of claim 8 wherein a conductance of said variable resistance element varies according to an incident light beam.

10. A linear tunable oscillator apparatus comprising:

a yttrium-iron-garnet sphere disposed in a magnetic circuit, said sphere having a diameter between about 5 mils and about 40 mils;

an output port;

an active element having a first active element port and a second active element port and providing a negative resistance over at least an octave of frequency above about 500 MHz at said first active element port;

a first coupling loop disposed adjacent to said sphere, such that said first coupling loop is loosely coupled to said sphere, said first coupling loop having a first coupling loop port connected to an RF ground and a second coupling loop port connected to said first active element port; and a second coupling loop also disposed adjacent to said sphere, said second coupling loop being geometrically arranged such that a first resonant current in said first coupling loop is at substantially 180 degrees phase difference relative to a second resonant current in said second coupling loop, said second coupling loop having a third coupling loop port and a fourth coupling loop port, said third coupling loop port connected to said second active element port and said fourth coupling loop port connected to said output port.

11. The apparatus of claim 10 wherein said first coupling loop and said second coupling loops are substantially semi-circular with a first loop radius and a second loop radius each at least 1.5 times greater than a radius of said sphere, thereby providing loose coupling between said sphere and said first and second coupling loops.

12. The apparatus of claim 10 wherein said active element is a gallium-arsenide integrated circuit comprising a Darlington pair of bipolar transistors, said integrated circuit having an input impedance that is substantially resistive and therefore substantially constant over at least an octave of frequency.

13. A wideband linear tunable oscillator apparatus comprising:

a yttrium-iron-garnet sphere with a diameter between about 5 mils and about 40 mils disposed in a magnetic circuit;

an output port;

a first active element having a first active element port and a second active element port and providing a negative resistance over at least an octave of frequency above about 2 GHz at said first active element port;

a second active element having a third active element port and a fourth active element port and providing a negative resistance over at least an octave of frequency above about 2 GHz at said third active element port;

a first coupling loop disposed adjacent to said sphere, such that said first coupling loop is loosely coupled to said sphere, said first coupling loop having a first coupling loop port connected to an RF ground and a second coupling loop port connected to said first active element port;

a second coupling loop also disposed adjacent to said sphere, said second coupling loop having a third coupling loop port and a fourth coupling loop port, said third coupling loop port connected to said second active element port and said fourth coupling loop port connected to said third active element port; and a third coupling loop also disposed adjacent to said sphere, said third coupling loop being geometrically arranged such that a first resonant current in said first coupling loop and a second resonant current in said second coupling loop are at substantially 180 degrees phase difference relative to a third resonant current in said third coupling loop, said third coupling loop having a fifth coupling loop port and a sixth coupling loop port, said fifth coupling loop port connected to said fourth active element port and said sixth coupling loop port connected to said output port.

* * * * *